United States Patent
Mizusawa et al.

Patent Number: 5,377,251
Date of Patent: Dec. 27, 1994

[54] EXPOSURE APPARATUS

[75] Inventors: Nobutoshi Mizusawa, Yamato; Ryuichi Ebinuma, Kawasaki; Hiroshi Kurosawa, Atsugi; Koji Uda, Yokohama; Takao Kariya, Hino; Shumichi Uzawa, Tokyo, all of Japan

[73] Assignee: Canon Kabushiki Kaisha, Tokyo, Japan

[21] Appl. No.: 203,498

[22] Filed: Feb. 28, 1994

Related U.S. Application Data

[60] Continuation of Ser. No. 904,255, Jun. 25, 1992, abandoned, which is a division of Ser. No. 666,649, Mar. 8, 1991, Pat. No. 5,172,402.

[30] Foreign Application Priority Data

Mar. 9, 1990 [JP] Japan ................................. 2-056674
Mar. 13, 1990 [JP] Japan ................................. 2-059904

[51] Int. Cl.⁵ ............................................. G21K 5/00
[52] U.S. Cl. ...................................... 378/34; 378/160
[58] Field of Search ............................................. 378/34

[56] References Cited

FOREIGN PATENT DOCUMENTS

| 83394 | 7/1983 | European Pat. Off. ............ 378/34 |
| 0357425 | 3/1990 | European Pat. Off. . |
| 56-104438 | 8/1981 | Japan . |
| 60-198726 | 10/1985 | Japan . |
| 01243519 | 9/1989 | Japan . |

*Primary Examiner*—Craig E. Church
*Attorney, Agent, or Firm*—Fitzpatrick, Cella, Harper & Scinto

[57] ABSTRACT

An exposure method for manufacture of semiconductor devices, includes moving a shutter having an edge so that the edge is related to a predetermined exposure region; projecting an exposure beam to the edge of the shutter and to at least a portion of the exposure region; determining a position of a shadow of the edge of the shutter formed by the exposure beam with respect to a predetermined coordinate system related to movement of a movable chuck; adjusting the shutter in accordance with the determination; placing a substrate on the chuck; moving the chuck so that the substrate is related to the exposure region; and controlling the exposure of the substrate with the exposure beam through the shutter.

8 Claims, 8 Drawing Sheets

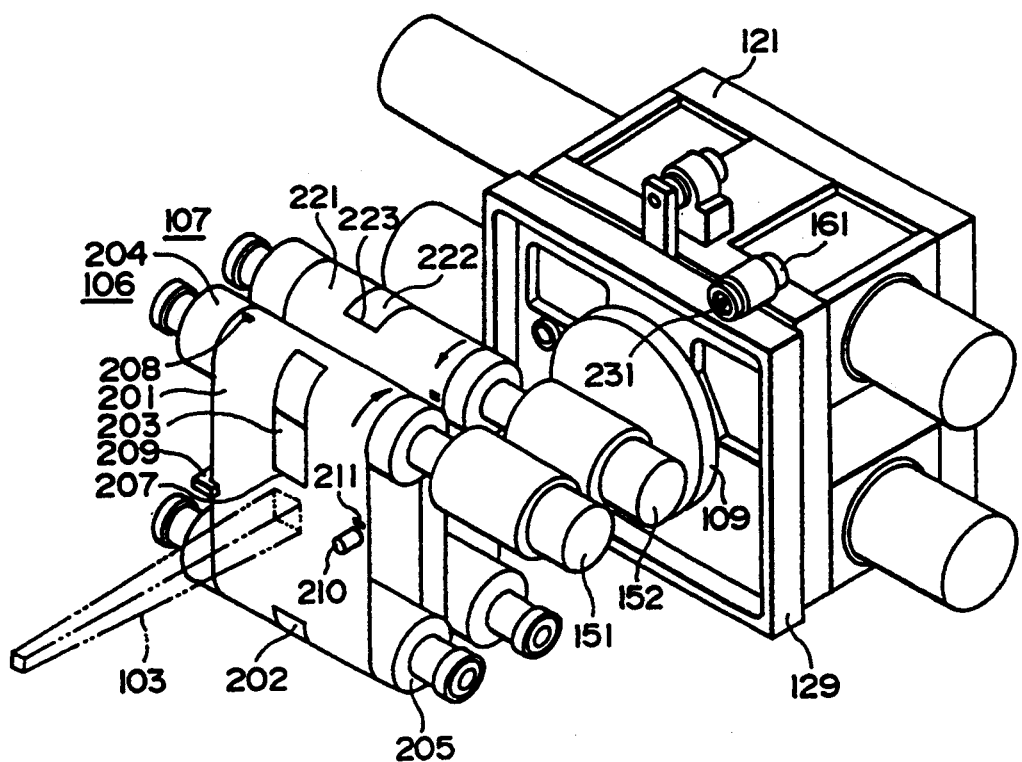
F I G. 2

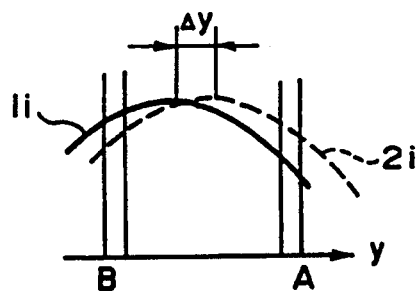
F I G. 3A
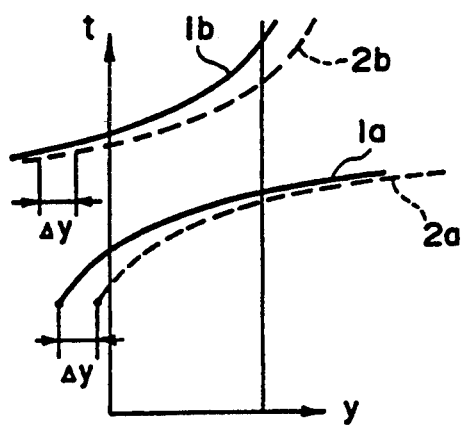
F I G. 3B
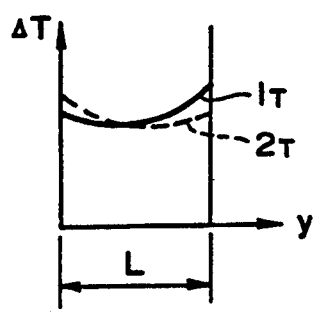
F I G. 3C

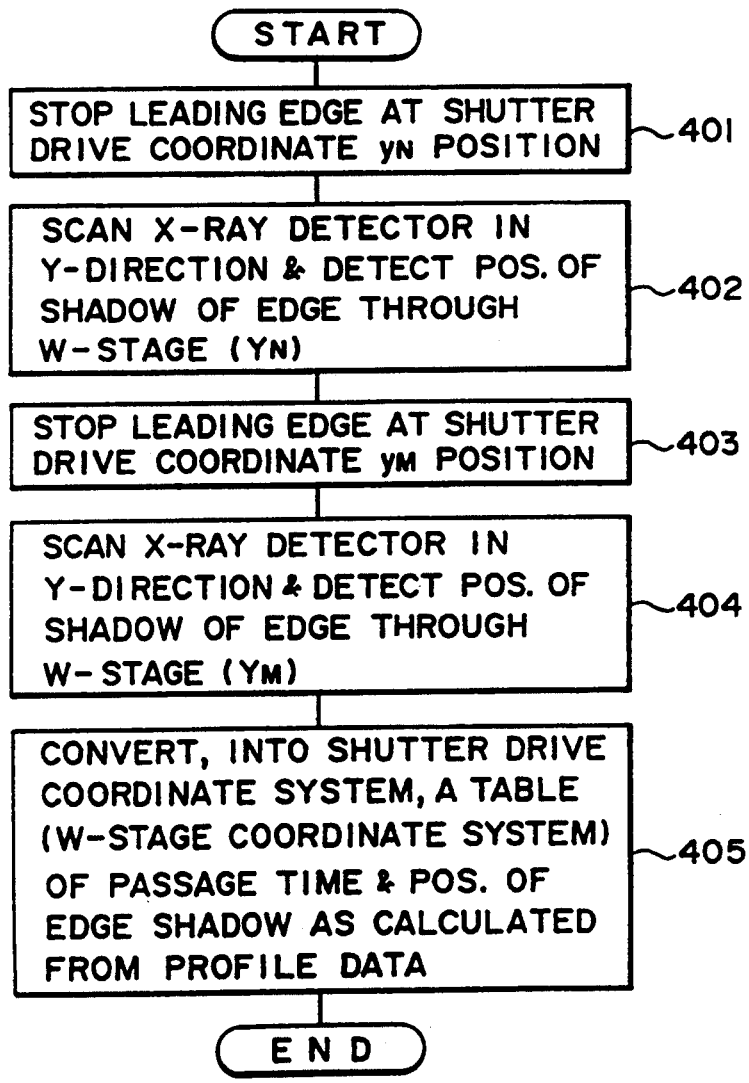
F I G. 4

EXPOSURE APPARATUS

This application is a continuation of application Ser. No. 07/904,255 filed Jun. 25, 1992, now abandoned, which is a division of application Ser. No. 07/666,649 filed Mar. 08, 1991 now U.S. Pat. No. 5,172,402.

FIELD OF THE INVENTION AND RELATED ART

This invention relates to an exposure apparatus and, more particularly, to an exposure apparatus for transferring and printing an image of an original, such as a mask, onto a workpiece such as a semiconductor wafer, with high precision.

With the increasing degree of integration of semiconductor integrated circuits, in an exposure apparatus (aligner) for manufacture of the same, further enhancement of transfer precision is required. As an example, for an integrated circuit of a 256 megabit DRAM, an exposure apparatus capable of printing a pattern of a linewidth of 0.25 micron order is necessary.

As such super-fine pattern printing exposure apparatus, an exposure apparatus which uses orbit radiation light (SOR X-rays) has been proposed.

The orbit radiation light has a sheet beam shape, uniform in a horizontal direction. Thus, for exposure of a plane of a certain area, many proposals have been made, such as:

(1) A scan exposure method wherein a mask and a wafer are moved in a vertical direction whereby the surface is scanned with X-rays of sheet beam shape in a horizontal direction;

(2) A scan mirror exposure method wherein X-rays of a sheet beam shape are reflected by an oscillating mirror whereby a mask and a wafer are scanned in a vertical direction; and (3) Simultaneous exposure method wherein X-rays of a sheet beam shape in a horizontal direction are diverged in a vertical direction by an X-ray mirror having a reflection surface machined into a convex shape, whereby an exposure region as a whole is irradiated simultaneously.

The inventors of the subject application have cooperated to devise such a simultaneous exposure type X-ray exposure apparatus, which is disclosed in Japanese Laid-Open Patent Application No. 243519/1989.

In this type of exposure apparatus, exposure light (X-ray) has uniform illuminance in a horizontal direction (hereinafter "X direction"). However, in a vertical direction (hereinafter "Y direction"), it has non-uniform illuminance such as depicted by an illuminance distribution curve $1i$ in FIG. 3A, for example, wherein the illuminance is high at a central portion and decreases away from the central portion. In the proposed apparatus, a blocking member having a rectangular opening (shutter aperture) is used, and the relationship of the time moment (t) of passage and the position in the Y direction of each of two edges, of four edges defining the opening, is controlled independently as depicted in FIG. 3B, whereby the exposure time ($\Delta T$) at each portion in an exposure region is controlled, as depicted in FIG. 3C. More specifically, the time period from the passage of a leading edge $1a$ of the blocking member (the preceding one of the two edges with respect to the movement direction of the blocking member), for allowing transmission of the exposure light (X-rays), to the passage of a trailing edge $1b$ of the opening of the blocking plate (the succeeding edge with respect to the movement direction of the blocking member), for interception of the exposure light, is controlled to thereby attain correct and uniform exposure of the whole exposure region. In that case, the exposure quantity control is effected on the basis of an X-ray illuminance distribution curve (hereinafter "profile") in the Y direction, such as depicted in FIG. 3A, as measured in the exposure region.

SUMMARY OF THE INVENTION

In this X-ray exposure apparatus, however, any deviation between the aforementioned profile and an edge drive curve produces a non-negligible effect upon the transfer precision.

For example, if edge drive curves as depicted by solid lines $1a$ and $1b$ in FIG. 3B, corresponding to the profile of solid line $1i$ in FIG. 3A, shift by $\Delta y$ to the positions of broken lines $2a$ and $2b$ in FIG. 3B, respectively, corresponding to the profile of broken line $2i$ in FIG. 3A, then the illuminance I of the exposure light at a position y changes by "(dI/dy) x $\Delta y$". Accordingly, in order to suppress the change in illuminance I to a quantity not greater than 0.1%, the following relation has to be satisfied:

$$\Delta y < (I/1000) \times [1/(dI/dy)] = (1/1000) \times \{1/[(dI/I)/dy)]\}$$

More particularly, if the view-angle size of the exposure region in the Y direction is 30 mm, if the profile such as depicted by the solid line $1i$ in FIG. 3A is represented by a quadratic function which is vertically symmetric with respect to a center line and if the lowest illuminance is 80% of the highest illuminance, then it follows that:

$$\Delta y < (1/1000) \times [1/(0.4/15)] \approx 0.04 \text{ (mm)}$$

Thus, it is seen that, in order to suppress non-uniformness in illuminance to a quantity not greater than 0.1%, the shift $\Delta y$ in relative position of the exposure light to the exposure region has to be kept at a quantity not greater than 40 microns.

A deviation in the edge drive curve or profile may result from a change in the relative attitude of a SOR device and a major assembly of the exposure apparatus, in a case of SOR X-ray exposure apparatus, and, generally, it may be attributable to an error between coordinate axes of a wafer stage and an edge driving system.

It is accordingly an object of the present invention to provide an exposure apparatus by which an exposure quantity error $\Delta I$ attributable to a relative deviation $\Delta y$ between the edge drive curve and the profile can be reduced to thereby enhance transfer precision.

In accordance with an aspect of the present invention, to achieve this object, there is provided an exposure apparatus, comprising: a radiation source with non-uniformness in illuminance generally in one-dimensional direction with respect to a predetermined exposure region; illuminance measuring means for measuring an illuminance distribution in the one-dimensional direction in the exposure region and in an area adjacent thereto; shutter means having a leading edge effective to start exposure in the exposure region and a trailing edge effective to stop the exposure; a memory with a drive table for setting a drive curve for the leading and trailing edges in accordance with the measured illuminance distribution; shutter driving means for causing the leading and trailing edges to move through the exposure region in the one-dimensional direction, independently of each other, in accordance with the drive table; edge position detecting means for detecting, with an illuminance detector of the illuminance measuring means and at different two points spaced in the one-dimension direction, a position of a shadow of one of said leading and trailing edges; and coordinate conversion means for effecting conversion of a coordinate system of the drive table and a coordinate system for the positioning of the illuminance detector during the illuminance distribution measurement, in accordance with results of the edge position detection.

With this structure, the position of the shadow of the edge as detected by the illuminance distribution measuring means with respect to at least two points, spaced in the direction of illuminance distribution, does correspond to the position of the edge, designated in terms of the coordinate system of the drive table, as projected upon the coordinate system used for the measurement of the illuminance distribution.

Accordingly, it is possible to detect the relationship between the coordinate system of the drive table and the coordinate system in the measurement of illuminance distribution and, by converting the coordinate system for the illuminance distribution measurement into the coordinate system of the drive table, an error between the coordinate systems of the illuminance distribution measurement and the drive table can be corrected and, as a result, non-uniformness in exposure (exposure quantity error) $\Delta I$ attributable to such error can be reduced.

The inventors of the subject application have made investigations into an exposure apparatus of the aforementioned type to attain further enhancement of the transfer precision, and have found that a change in the relative position of the exposure region and the exposure light provides a non-negligible effect on the transfer precision. Particularly, in the proximity exposure process, a change in the angle of incidence of the exposure light to the exposure region results in degradation of the superposing precision.

For example, if the proximity gap G between a mask and a wafer is 50 microns, then, in order to suppress a superposition error $\Delta \delta$ due to a change in the angle of incidence to a quantity not greater than 0.002 micron, the change $\Delta \theta$ in the angle of incidence has to be suppressed to satisfy:

$$\Delta \theta = \Delta \delta / G < 0.002/50 = 4 \times 10^{-5} \ (rad)$$

Namely, it has to be suppressed to a quantity not greater than $4 \times 10^{-5}$ rad.

Further, if the exposure light has a divergent angle, the angle of incidence of the exposure light to the exposure region changes with the shift $\Delta y$ of the relative position as described above. If the interval between the surface to be exposed and the point of divergence (e.g. the position of incidence of X-rays upon a divergence convex mirror of a SOR X-ray exposure apparatus) is 5 m, then the quantity $\Delta \theta$ of change in the angle of incidence is given by:

$$\Delta \theta = \Delta y / 5000 < 4 \times 10^{-5} \ (rad)$$

From this change $\Delta \theta$ in the angle of incidence, the above-described superposition error $\Delta \delta$ results. The superposition error $\Delta \delta$ in this case appears at different portions of the surface to be exposed, as a run-out error of distributed transfer magnifications. From the above equation, it is seen that the change $\Delta y$ in the relative position has to be suppressed to a quantity not greater than 0.2 mm.

Further, if in the positional relationship between the exposure light and the exposure region there occurs a rotational deviation $\Delta \omega_z$ about an axis (Z axis) of the path of the exposure light, then, at a position (X, Y) on the X-Y plane having an origin on that axis, there are caused an error $\Delta \theta$ in the angle of incidence as well as an illuminance change $\Delta I$ and an error $\Delta \delta$, equivalently as there is caused a change $\Delta y$ wherein $\Delta y = Y \cdot \cos \omega_z$.

As regards the variations, such as the relative positional deviation $\Delta y$ and $\Delta \omega_z$, one of which is attributable to an attitude change of the exposure apparatus resulting from movement of a wafer stage of about 200 microns, a displacement resulting from a temperature change may be of about 10 microns and a displacement resulting from vibration of a floor may be about 2 microns.

It is another object of the present invention to provide an exposure apparatus by which an exposure quantity error $\Delta I$ and a superposition error $\Delta \delta$ attributable to the rotational deviation $\Delta \omega_z$ can be reduced, to thereby attain further enhancement of the transfer precision.

In accordance with another aspect of the present invention, to achieve this object, there is provided an exposure apparatus, comprising: a radiation source with non-uniformness in illuminance generally in a one-dimension direction with respect to a predetermined exposure region; exposure quantity correcting means for setting an exposure time distribution in accordance with the non-uniformness in illuminance so as to assure a substantially uniform exposure quantity in the exposure region; illuminance distribution measuring means for measuring an illuminance distribution in the exposure region; computing means for calculating a constant-illumination line on the basis of a measured data of the measuring means; and paralleling means for making the constant-illumination line and a constant-exposure-time line of said exposure quantity correcting means parallel.

In this structure, the illuminance distribution measuring means serves to measure an illuminance distribution in the exposure region and an area adjacent thereto, the computing means serves to calculate a constant-illuminance line on the basis of measured illuminance distribution data, and the paralleling means serves to execute an operation making the calculated constant-illuminance line and a constant-exposure-time line determined by the exposure quantity correcting means parallel. By this paralleling operation, the rotational deviation $\omega_z$ can be corrected and, therefore, the exposure quantity error $\Delta I$ and the superposition error $\Delta \delta$ attributable to such rotational deviation $\omega_z$ can be reduced.

It is a further object of the present invention to provide an exposure method and apparatus by which uniform exposure is attained and, thus, a resist pattern of uniform linewidth is assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a perspective view, showing details of an exposure shutter device of the FIG. 1 embodiment.

FIGS. 3A-3C are graphs, respectively, for explaining the operation of the exposure apparatus of the FIG. 1 embodiment, wherein FIG. 3A shows an illuminance distribution (profile) of illumination light, FIG. 3B shows shutter drive curves and FIG. 3C shows an exposure time distribution.

FIG. 4 is a flow chart for explaining the coordinate system converting operation in the exposure apparatus of the FIG. 1 embodiment.

DESCRIPTION OF THE PREFERRED EMBODIMENTS

Figure 1:
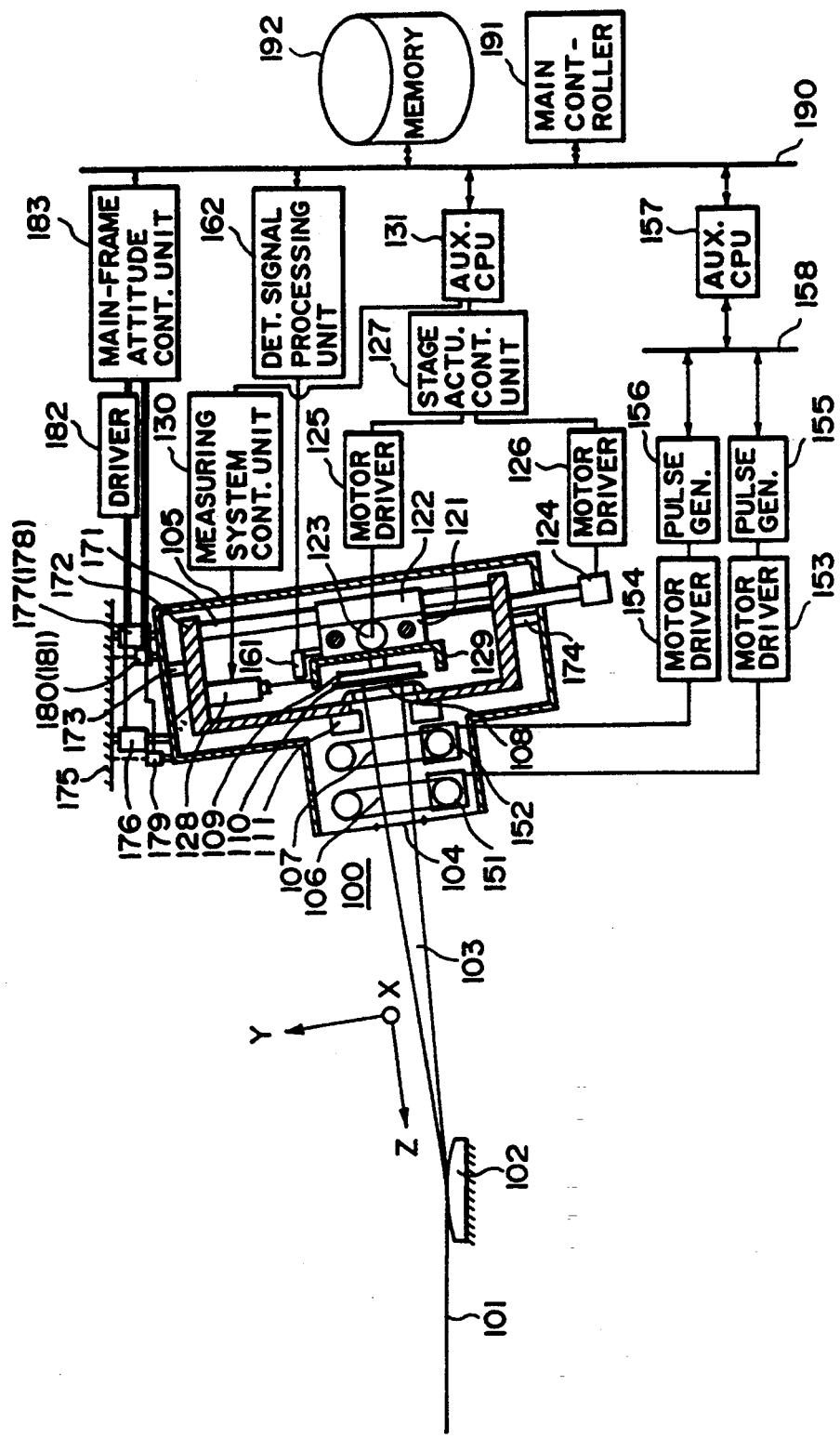
FIG. 1 is a schematic and diagrammatic view of an X-ray exposure apparatus according to an embodiment of the present invention.

FIG. 1 shows a general structure of an X-ray exposure apparatus according to an embodiment of the present invention. Denoted in the drawing at 101 is a synchrotron orbit radiation light (SOR X-ray), and denoted at 102 is an exposure mirror having a reflection surface machined into a convex shape, for expanding the SOR X-ray 101, of a sheet beam shape elongated in the X (substantially horizontal) direction, in the Y (substantially vertical) direction. The bundle of X-rays from the exposure mirror 102 diverging in the Y direction is inputted into an exposure apparatus main assembly 100 as an illumination light (exposure beam) 103 for the exposure process.

In the exposure apparatus main assembly 100, denoted at 104 is a beryllium window for isolating an exposure X-ray input path, maintained at a high vacuum, and a helium ambience in a chamber 105, from each other. Denoted at 106 is an auxiliary shutter unit (movable aperture unit) comprising an endless steel (SUS) belt having openings. It cooperates with a main shutter unit 107 of a similar structure to provide an exposure shutter device. Denoted at 108 is a mask having a pattern, to be transferred, formed thereon by use of an X-ray non-transmissive material such as gold, for example, Denoted at 109 is a wafer chuck with which a wafer 110, onto which an image of the mask 108 is to be transferred, can be held fixed on a wafer stage that comprises an X stage 121 and a Y stage 122, for example. The wafer 110 is coated with a resist which is sensitive to X-rays. Denoted at 111 is an alignment optical unit for measuring the relative positional relationship between the mask 108 and the wafer 110; denoted at 123 is an X stage motor for driving the X stage 121; denoted at 124 is a Y stage motor for driving the Y stage 122; denoted at 125 and 126 are motor drivers for the X stage motor 123 and the Y stage motor 124, respectively; denoted at 127 is a stage actuator control unit for controlling the operations of the motor drivers 125 and 126, respectively; denoted at 128 is a laser length-measuring device for measuring the position of the wafer stage; denoted at 129 is a mirror for the laser length-measurement; and denoted at 130 is a length measuring system control unit. Denoted at 131 is a central processing unit (CPU) which is communicated with a main controller 191 through a common bus 190, to control the stage actuator control unit 127 and the measuring system control unit 130.

Denoted at 151 is an auxiliary shutter motor for driving the auxiliary shutter unit 106, and denoted at 152 is a main shutter motor for driving the main shutter unit 107. Denoted at 153 and 154 are motor drivers, respectively, for driving the motors 151 and 152 in accordance with the number of pulses outputted from pulse generators 155 and 156, respectively. Denoted at 157 is a subsidiary CPU which is communicated with the main controller 191 through the common bus 190 and which serves to control the pulse generators 155 and 156 through a local bus 158. Denoted at 161 is an X-ray detector, and denoted at 162 is a detector signal processing unit.

Denoted at 171 is a Y guide bar for guiding the Y stage 122, and it is fixed to a main frame 172. The main frame 172 is fixed to the chamber 105 through an upper support 173 and a lower support 174. Denoted at 175 is a frame base, and the chamber 105 is supported by actuators 176-178 provided at three locations on the chamber top (at front side and rear left and rear right sides of the top). The attitude of the chamber 105 can be controlled by these actuators. Adjacent to these actuators 176-178, there are provided three distance sensors 179-181. By measuring through these sensors 179-181 the distances to the frame base 175 from the mounting positions of these sensors, respectively, the attitude of the chamber 105 can be detected. Denoted at 182 is a driver for driving the actuators 176-178. Denoted at 183 is a main assembly attitude control unit which serves to detect the attitude of the chamber 105 on the basis of the outputs from the sensors 179-181 and to control the attitude of the chamber 105 through the drive of the driver 182.

Denoted at 191 is a main controller which serves to control the operation of the exposure apparatus as a whole through the common bus 190, in accordance with the content memorized in a memory 192.

FIG. 2 is a perspective view schematically showing the exposure shutter device, comprising the auxiliary shutter unit 106 and the main shutter unit 107 of FIG. 1, as well as some elements necessary for explaining the function of the exposure shutter device. In non-exposure period, the exposure beam 103 is blocked in the auxiliary shutter unit 106, as shown in FIG. 2, by an auxiliary shutter belt 201 which is provided by a steel belt made of stainless steel. In the exposure period, on the other hand, the exposure beam 103 goes through a front opening 202 formed in the auxiliary shutter belt 201 as well as a rear opening 203 of the auxiliary shutter belt, moved to a position approximately opposed to the front opening 202, and the exposure beam arrives at a main shutter belt 221 of the main shutter unit 107 disposed behind the auxiliary shutter belt 201. Like the auxiliary shutter belt 201 of the auxiliary shutter unit 106, also the main shutter belt 221 is provided with two openings, namely, a front opening 222 and a rear opening (not shown). The above-described function of controlling local exposure time at each of different portions of the exposure region in the Y direction is accomplished by controlling, at each portion in the Y direction, the time period from the passage, through that portion, of a leading edge 223 of the front opening 222 of the main shutter belt 221 to the passage of the trailing edge (not shown) through that portion, so as to provide an inversely proportional relationship between the time period and the illuminance of X-rays. In other words, the time period is so controlled that, at different portions in the Y direction, the quantity of energy absorption by the resist applied to the wafer is regular and correct.

The auxiliary shutter belt 201 is tensioned between an auxiliary shutter driving drum 204, driven by the auxiliary shutter motor 151, and an auxiliary shutter idler drum 205, and it is driven through the friction between the inside surface of the shutter belt 201 and the outside surface of the driving drum 204. In order to assure stable driving of the shutter belt 201 so as to avoid snaking, the driving drum 204 is crowned such that the diameter at the central portion of the drum with respect to the widthwise direction is made larger by 50-100 microns than the diameter at the end portion. The shutter belt 201 is provided with small rectangular slits 208 and 211, formed in the neighborhood of the left-side and right-side edges thereof, for the position detection and the timing detection, respectively. These slits cooperate with a photointerruptor 209 and a reflection sensor 210, respectively, to produce a start signal for the driving of the auxiliary shutter motor 151 to be made in accordance with a predetermined drive pattern, or to discriminate whether the exposure beam 103 is allowed to pass or is blocked.

The main shutter device has a similar mechanical structure as of the auxiliary shutter device, described above.

Denoted at 231 is a pinhole formed in a front face of a detection portion of the X-ray detector 161, which is mounted to the X stage 121 (see FIG. 1).

X-ray intensity profile such as at 1$i$ (2$i$) in FIG. 3A can be measured by bringing the two shutter units 106 and 107 into open states, respectively, and by moving the Y stage 122 (see FIG. 1) so as to scanningly displace the X-ray detector 161 in the Y direction within the exposure view angle (exposure region). On the basis of measured data, drive tables 1$a$ and 1$b$ (2$a$ and 2$b$) such as is shown in FIG. 3B for the leading edge 223 and the trailing edge 107 can be prepared, and corrected drive such as shown in FIG. 3C for attaining constant quantity of energy absorption by the resist in the exposure region can be executed.

In this case, the X-ray intensity profile measurement is made on the basis of a coordinate system of the X-ray detector 161 (X-Y coordinate system of the wafer stage, comprising X stage 121 and Y stage 122, as measured through the laser length-measuring device 128). On the other hand, the corrected drive of the shutter is made on the basis of a shutter drive coordinate system (x-y coordinate system of the drive table). For this reason, if there is a deviation between these coordinate systems, it is not possible to accomplish proper drive correction. In the present embodiment, in consideration thereof, after a drive table representing the position (Y) versus passage time (t) relation of each edge with respect to the wafer stage coordinate system is prepared on the basis of the profile measured data, the relationship between the wafer stage coordinate system and the shutter drive coordinate system is detected and conversion is made to the position coordinate of the edge, from a coordinate value Y with respect to the wafer stage coordinate system into a coordinate value y with respect to the shutter drive coordinate system. By this, the drive table is converted into a table that represents the position (y) versus passage time (t) relation of the edge with respect to the shutter drive coordinate system, and, as a result, precise exposure quantity correction is assured.

The details of such coordinate system conversion in this exposure apparatus will now be explained. The coordinate system conversion may be executed together with the profile measurement, at the time of assembling of the exposure apparatus, at the time of setting of the same or at the time of maintenance thereof (in maintenance mode).

Figure 7:
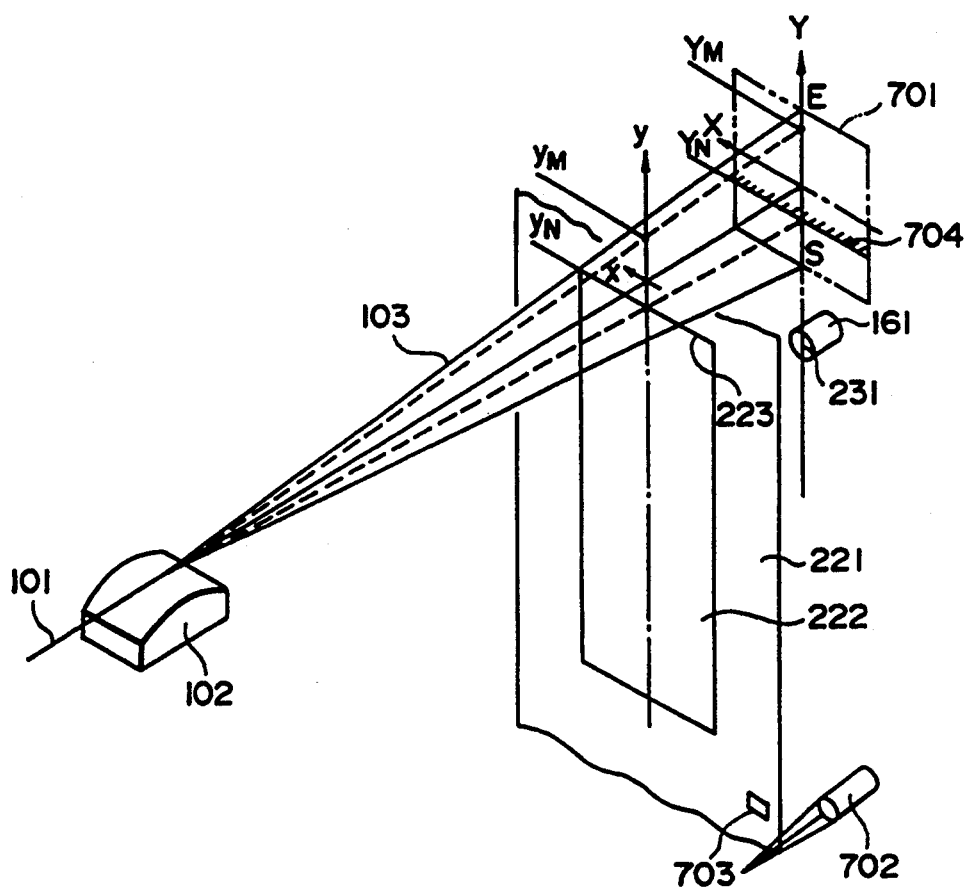
FIG. 7 is a schematic view for explaining edge detection in the exposure apparatus of the FIG. 1 embodiment.

Referring to the flow chart of FIG. 4, first, at step 401, the main shutter belt 221 is stopped at such a position that, as shown in FIG. 7, the leading edge 223 of the opening 222 of the main shutter belt 221 blocks a portion of the exposure view angle. It is assumed that the shutter drive coordinate at this time is $y_N$. In FIG. 7, denoted at 701 is an illuminance detecting area corresponding to the exposure view angle; denoted at 702 is a high-precision reflection type sensor at the main shutter unit 107 side (see FIG. 1); denoted at 703 is a slit which is cooperable with the high precision reflection type sensor 702 to determine an origin of the coordinate system representing the position of the edge 223; and denoted at 704 is the shadow of the edge 223. At step 402 in FIG. 4, the wafer stage is moved so as to scanningly displace the X-ray detector 161 in the Y direction to thereby detect the wafer stage coordinate (the position with respect to the illuminance distribution measurement coordinate system) $Y_N$ of the shadow 704 of the edge 223 (FIG. 7).

Figure 8:
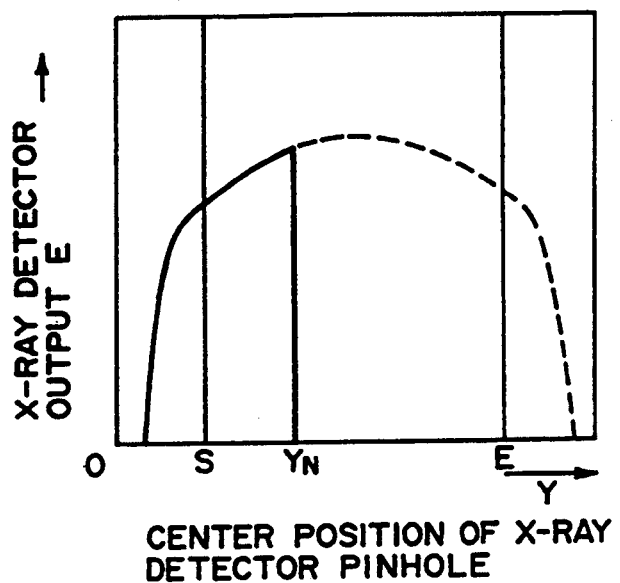
FIGS. 8 and 9 are graphs, respectively, for explaining the operation of an X-ray detector for the edge detection, in the exposure apparatus of the FIG. 1 embodiment.
Figure 9:
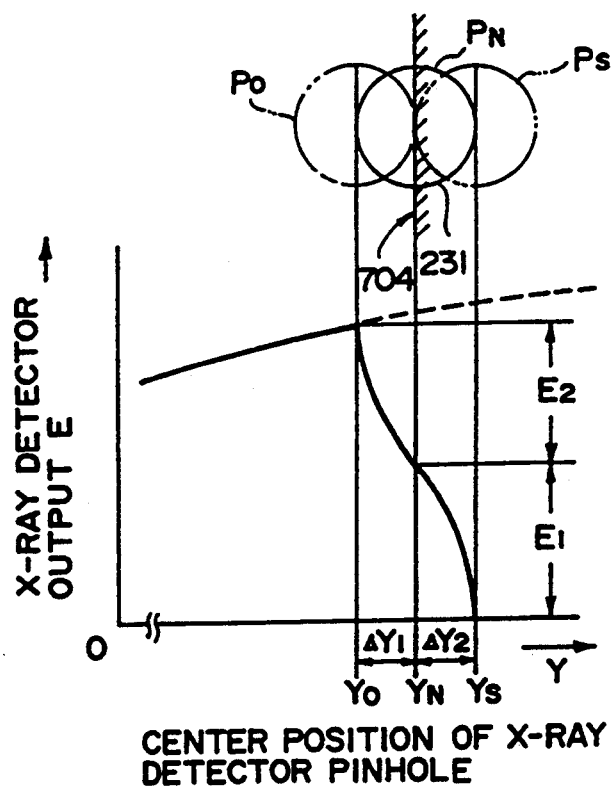

FIG. 8 illustrates the relationship between the Y-direction position of the pinhole 231 of the X-ray detector 161 and the output of the X-ray detector 161. In this drawing, reference character $Y_N$ denotes the position of the shadow of the edge 223, and a broken line depicts the exposure profile to be defined in the region blocked by the shutter 221, which otherwise is exposed with the exposure beam 103 when the shutter is open. Enlarging the portion near $y_N$ in FIG. 8 in the Y direction, the change in the output depending on the relationship between the shadow $Y_N$ of the edge and the pinhole 231 at the front face of the X-ray detector 161 is such as shown in FIG. 9. In FIG. 9, reference character $P_O$ denotes the position of the pinhole 231 just at the moment as the pinhole 231 goes out of the shadow 704 of the edge 223. Reference character $P_N$ denotes the position of the pinhole 231 at which the center of the pinhole coincides with the shadow 704 of the edge 223. Reference character $P_S$ denotes the position of the pinhole 231 just at the moment as the pinhole 231 is completely shaded by the shadow 704 of the edge 223. It is seen from FIG. 9 that accurately the position $Y_N$ of the shadow 704 of the edge is at the middle point ($\Delta Y_1 = -\Delta Y_2$) between a coordinate $Y_O$ corresponding to the position $P_O$ and a coordinate $Y_S$ corresponding to the position $P_S$. In this embodiment, in consideration thereof, the middle point between the coordinate $Y_S$ at the rise of the output of the X-ray detector 161 and the coordinate $Y_O$ at the saturation point of the detector output is determined as the coordinate (edge position) $Y_N$ corresponding to the end line of the shadow 704 of the edge 223.

When the pinhole 231 is at the position $P_N$, the output of the X-ray detector 161 is not always equal to a half of the output when the pinhole 231 is at the position $P_O$, i.e., $E_1 \neq E_2$. This is because the output component based on the edge position and the component based on the illuminance distribution (profile) are not discriminated separately. Referring back to FIG. 4, at step 403, the motor 152 is driven so that the leading edge 223 is moved to a position, blocking another portion of the exposure view angle 701, namely, to a position of a shutter drive coordinate $y_M$. Then, at step 404, like step 402, a wafer stage coordinate $Y_M$ of the shadow 704 of the edge 223 is detected.

When the wafer stage coordinates $Y_N$ and $Y_M$ corresponding to the shutter drive coordinates $y_N$ and $y_M$ at two different points in the exposure view angle 701, spaced in the Y direction, are detected in the manner described above, then at step 405, the coordinate of the edge position in the drive table of edge position (Y) versus passage time (t) relation with respect to the wafer stage coordinate system, having been calculated on the basis of the profile measured data and having been stored in the memory 192, is converted from a coordinate Y with respect to the wafer stage coordinate system into a coordinate y with respect to the shutter drive coordinate system, by using the following equation:

$$y = y_N + (Y - Y_N) \times (y_M - y_N)/(Y_M - Y_N)$$

By this, the drive table is converted into one that represents the position (y) versus passage time (t) relation of the edge with respect to the shutter drive coordinate system. Then, by using the obtained table, the main shutter unit 107 is controlled and the exposure process of the wafer 110 to the mask 108 with the exposure beam 103 is executed. The table obtained by the conversion is stored in into the memory 192.

In the foregoing example, the shadow of the leading edge 223 is detected and the coordinate system of the illuminance distribution detector is converted into a coordinate system of the edge drive table. However, in place of detecting the shadow of the leading edge 223 of the opening 222 of the main shutter belt 221, the shadow of the trailing edge may be detected and the coordinate system conversion may be made accordingly.

Next, a description will be provided of a paralleling operation of the exposure apparatus. Such a paralleling operation may be executed at the time of assembling of the exposure apparatus, at the time of setting of the exposure apparatus or at the time of maintenance of the apparatus (in maintenance mode).

Figure 5:
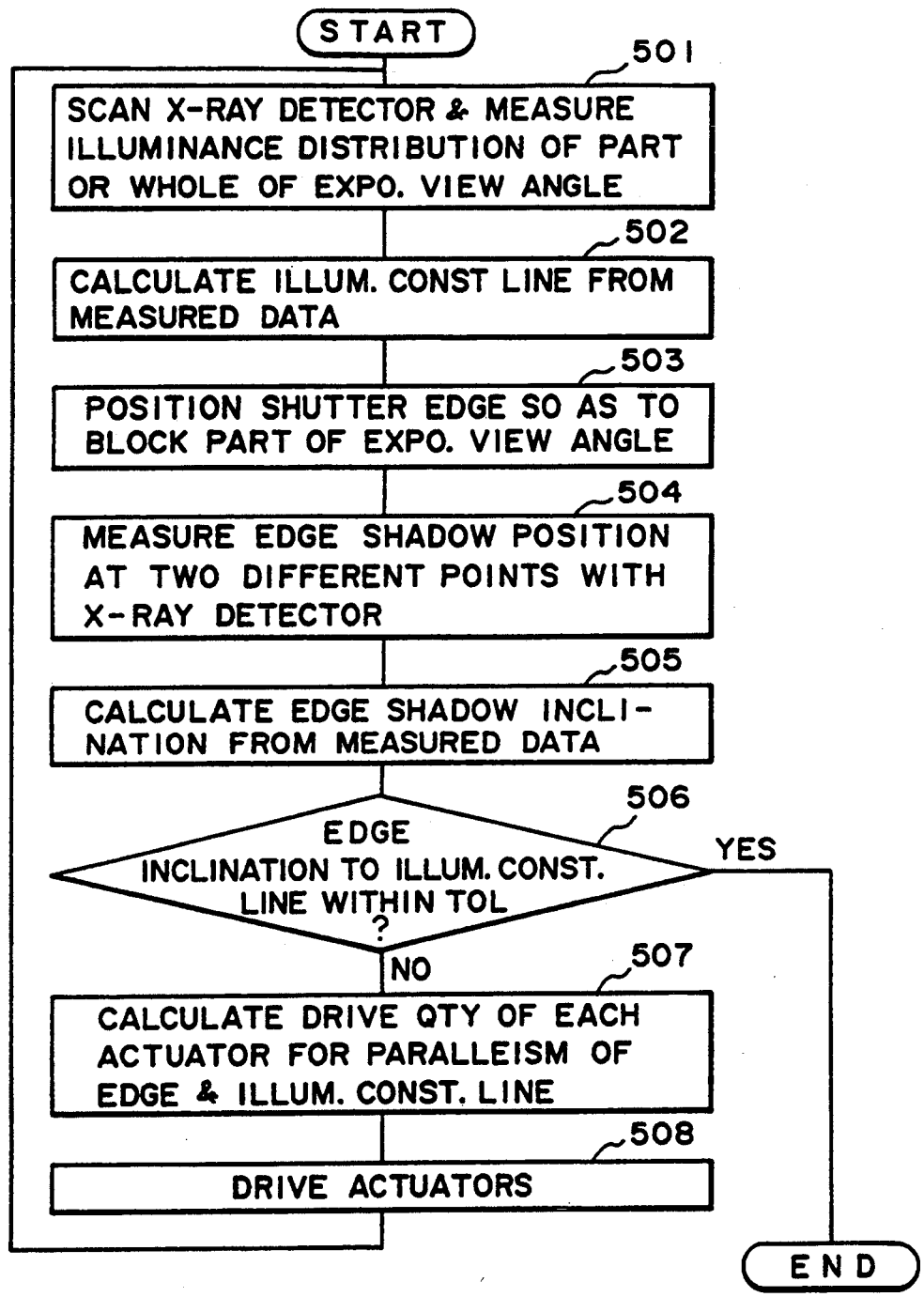
FIG. 5 is a flow chart for explaining the paralleling operation in the exposure apparatus of the FIG. 1 embodiment.
Figures 6A, 6C:
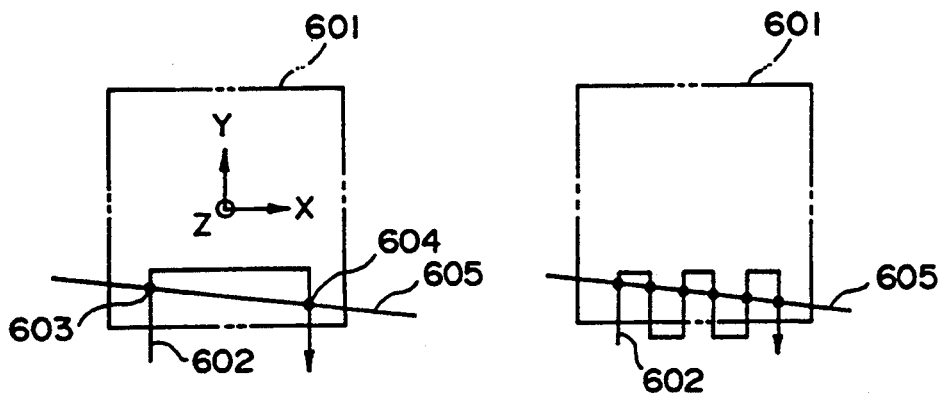
FIGS. 6A-6D are schematic views, respectively, for explaining detection of constant-intensity lines in the exposure apparatus of the FIG. 1 embodiment.
Figures 6B, 6D:
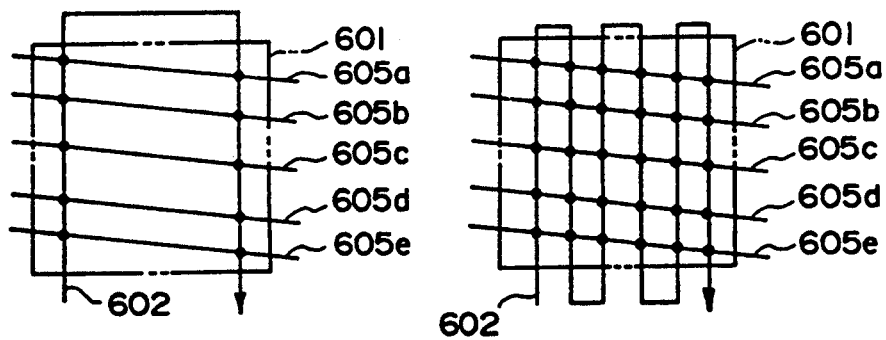

Referring to the flow chart of FIG. 5, first, at step 501, while holding the shutter in its open state, the wafer stage is moved to scanningly displace the X-ray detector 161 in the X and Y directions, and an illuminance distribution of a part of or the whole of the exposure view angle 601 is measured. At step 502, from measured data, a line or lines of constant illuminance (constant-intensity lines) are detected. FIGS. 6A–6C show examples of manner of scan. Since the exposure beam 103 (see FIG. 1) has non-uniformness in intensity substantially only in the Y direction, where as shown in FIG. 6A the scan is made along a path 602 which includes a small distance in the Y direction at a rightward end portion of the illuminance detection plane 601 as well as a small distance in the Y direction at a leftward end portion of the illuminance detection area and when a straight line 605 is drawn to connect points 603 and 604 having the same measured values of illuminance, then the line 605 provides a constant-intensity line. FIG. 6B shows an example wherein, as compared with the scan method shown in FIG. 6A, the Y-direction scanning lengths at the leftward and rightward portions are increased so as to obtain a larger number of constant-intensity lines 605a–605e. FIGS. 6C and 6D show examples wherein, as compared with the scanning methods of FIGS. 6A and 6B, a larger number of Y-direction scanning lines are used. By using multiple measuring points for obtaining a single constant-intensity line, even in the case where a constant-intensity line is not straight, an approximate straight line can be drawn on the basis of a least square method or the like to determine the constant-intensity line with a reduced error. In FIG. 6, denoted at 601 is the illuminance detecting area; denoted at 602 is the path of scan of the X-ray detector 161; denoted at 603 and 604 are those points at which the X-ray detector 161 produces outputs of the same level; and denoted at 605 and 605a–605e are constant-intensity lines.

Then, at step 503 in FIG. 5, the main shutter motor 152 is driven to move and stop the main shutter belt 221 at a position at which, as shown in FIG. 7, the leading edge 223 of the opening 222 of the main shutter belt 221 blocks a portion of the exposure view angle 701. In FIG. 7, denoted at 701 is the exposure view angle of a size corresponding to or slightly smaller than the illuminance detecting area 601 in FIG. 6. The illuminance detecting area 601 is so set that it is larger than the exposure view angle 701 at least with respect to the Y direction and that the whole exposure angle 701 is included inside the illuminance detecting area 601, so as to allow measurement of the illuminance at a portion around the exposure view angle 701 through the X-ray detector 161. Denoted at 702 is a high-precision reflection type sensor at the main shutter unit 107 side (see FIG. 1), and denoted at 703 is a slit which is cooperable with the high-precision reflection type sensor 702 to determine the origin of a coordinate system representing the position of the edge 223. It is to be noted here that, at step 503, in place of using the leading edge 223 of the opening 222 of the main shutter belt 221, the trailing edge (not shown) thereof may be used to block a portion of the exposure view angle. Subsequently, at step 504, the X-ray detector 161 on the wafer stage is used to measure the position of the shadow 704 of the edge 223 in the Y direction, at two different points spaced in the X direction, to thereby detect any inclination of the edge shadow 704 with reference to the X axis (Y axis) of the X-Y plane.

FIG. 8 illustrates the relationship between the Y-direction position of the pinhole 231 of the X-ray detector 161 and the output of the X-ray detector 161. In this drawing, reference character $Y_N$ denotes the position of the shadow of the edge 223, and a broken line depicts the exposure profile to be defined in the region blocked by the shutter 221, which otherwise is exposed with the exposure beam 103 when the shutter is open. Enlarging the portion near $y_N$ in FIG. 8 in the Y direction, the change in the output depending on the relationship between the shadow $Y_N$ of the edge and the pinhole 231 at the front face of the X-ray detector 161 is such as shown in FIG. 9. In FIG. 9, reference character $P_O$ denotes the position of the pinhole 231 just at the moment as the pinhole 231 goes out of the shadow 704 of the edge 223. Reference character $P_N$ denotes the position of the pinhole 231 at which the center of the pinhole coincides with the shadow 704 of the edge 223. Reference character $P_S$ denotes the position of the pinhole 231 Just at the moment as the pinhole 231 is completely shaded by the shadow 704 of the edge 223. It is seen from FIG. 9 that accurately the position $Y_N$ of the shadow 704 of the edge is at the middle point ($\Delta Y_1 = -\Delta Y_2$) between a coordinate $Y_O$ corresponding to the position $P_O$ and a coordinate $Y_S$ corresponding to the position $P_S$. In this embodiment, in consideration thereof, the middle point between the coordinate $Y_S$ at the rise of the output of the X-ray detector 161 and the coordinate $Y_O$ at the saturation point of the detector output is determined as the coordinate (edge position) $Y_N$ corresponding to the end line of the shadow 704 of the edge 223.

When the pinhole 231 is at the position $P_N$, the output of the X-ray detector 161 is not always equal to a half of the output when the pinhole 231 is at the position $P_O$ i.e., $E_1 \neq E_2$. This is because the output component based on the edge position and the component based on the illuminance distribution (profile) are not discriminated separately.

In the manner described above, the edge position $Y_N$ is detected at least at two locations including the leftward and rightward end portions in the X direction. Subsequently, at step 505 in FIG. 5, from the results of detection of the edge position $Y_N$ and the constant-intensity line or lines 605 determined beforehand, any inclination of the leading edge 223 or the trailing edge 207 in the X-Y plane with respect to the constant-intensity line 605 is determined. At step 506, discrimination is made as to whether the inclination of the edge 223 with respect to the constant-intensity line 605 is not greater than a predetermined inclination. If not, the paralleling operation is finished. If on the other hand the inclination is greater than the predetermined inclination, the sequence goes to step 507 whereat drive quantities for the actuators 176-178 (FIG. 1) necessary for the paralleling of the edge 223 with the constant-intensity line 605, are calculated. Then, at step 508, these actuators 176-178 are driven and, after this, the sequence goes back to 501 and the operations at steps 501-506 are repeated. After completion of the paralleling operation, the wafer 110 is exposed to the mask 108 with the exposure beam 103, while being controlled by the main shutter 107.

While the foregoing description has been made of an exposure apparatus wherein the exposure beam 103 comprises SOR X-rays, the present invention is not limited thereto but is applicable also to an exposure apparatus which uses an exposure beam comprising g-line light, i-line light, an excimer laser light or the like.

While the invention has been described with reference to the structures disclosed herein, it is not confined to the details set forth and this application is intended to cover such modifications or changes as may come within the purposes of the improvements or the scope of the following claims.

What is claimed is:

1. An exposure method, comprising the steps of:
   illuminating a predetermined exposure zone with illumination light having a non-uniform illuminance distribution substantially along a predetermined direction and with respect to the predetermined exposure zone;
   measuring a two-dimensional illuminance distribution upon the predetermined exposure zone;
   determining the direction of non-uniformness of the illuminance distribution of the illumination light on the basis of said measurement;
   adjusting a relative positional relationship between the illumination light and a shutter mechanism having an edge movable in a direction, so as to substantially register the determined direction of the non-uniformness of the illumination light with the direction of movement of the edge of the shutter mechanism; and
   adjusting, through the shutter mechanism, exposure time at each portion of the exposure zone so as to attain uniform exposure of the exposure zone.

2. A method according to claim 1, wherein the illumination light comprises X-rays.

3. A method according to claim 1, wherein said method is used with a mask having a pattern and with a wafer, and wherein the pattern of the mask is printed on the wafer through the exposure.

4. An exposure apparatus, comprising:
   a light source for providing illumination light for illuminating a predetermined exposure zone, said illumination light having a non-uniform illuminance distribution substantially along a predetermined direction and with respect to the predetermined exposure zone;
   a detector for measuring a two-dimensional illuminance distribution upon the predetermined exposure zone;
   computing means for determining the direction of non-uniformness of the illuminance distribution of the illumination light on the basis of the measurement through said detector;
   a shutter mechanism having an edge which is movable in a direction, for adjusting an exposure time at each portion of the predetermined exposure zone so as to attain uniform exposure of the predetermined exposure zone; and
   adjusting means for adjusting a relative positional relationship between the shutter mechanism and the illumination light so as to substantially register the direction of non-uniformness, as determined by said computing means, with the direction of movement of said edge of said shutter mechanism.

5. An apparatus according to claim 4, further comprising a stage, and wherein said detector is mounted on said stage which is movable two-dimensionally.

6. An apparatus according to claim 4, wherein said light source comprises a synchrotron radiation source adapted to produce X-rays, and wherein said detector comprises an X-ray detector.

7. An apparatus according to claim 4, wherein said shutter mechanism has a leading edge effective to start exposure of the exposure zone and a trailing edge effective to stop the exposure of the exposure zone.

8. An apparatus according to claim 4, wherein said apparatus is used with a mask having a pattern and with a wafer, and wherein said apparatus further comprises a mechanism for holding the mask and the wafer, and wherein the pattern of the mask is printed on the wafer through an exposure.

* * * * *

UNITED STATES PATENT AND TRADEMARK OFFICE
CERTIFICATE OF CORRECTION

PATENT NO. : 5,377,251
DATED : December 27, 1994
INVENTOR(S) : NOBUTOSHI MIZUSAWA, et al.

It is certified that error appears in the above-indentified patent and that said Letters Patent is hereby corrected as shown below:

ON THE COVER PAGE

[75] Inventors

"Shumichi Uzawa" should read --Shunichi Uzawa--.

[56] References Cited

FOREIGN PATENT DOCUMENTS

"01243519 9/1989 Japan" should read
--1-243519 9/1989 Japan--.

COLUMN 1

Line 7, "Mar. 08, 1991" should read --Mar. 8, 1991--.
Line 38, "Simultaneous" should read --A simultaneous--.

COLUMN 9

Line 37, "into" should be deleted.

UNITED STATES PATENT AND TRADEMARK OFFICE
CERTIFICATE OF CORRECTION

PATENT NO. : 5,377,251

DATED : December 27, 1994

INVENTOR(S) : NOBUTOSHI MIZUSAWA, et al.

It is certified that error appears in the above-indentified patent and that said Letters Patent is hereby corrected as shown below:

<u>COLUMN 11</u>

Line 20, "$P_0$" should read --$P_0$,--.
Line 37, "If on" should read --If, on--.

Signed and Sealed this

Twenty-third Day of May, 1995

Attest:

BRUCE LEHMAN

Attesting Officer

Commissioner of Patents and Trademarks